United States Patent
Keeney

(10) Patent No.: US 6,462,990 B1
(45) Date of Patent: Oct. 8, 2002

(54) POST ERASE REPAIR TO ENHANCE PERFORMANCE IN A FLASH MEMORY

(75) Inventor: Stephen N. Keeney, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/752,197

(22) Filed: Dec. 29, 2000

(51) Int. Cl.⁷ ............................................... G11C 16/04
(52) U.S. Cl. .............................. 365/185.29; 365/185.22
(58) Field of Search ........................ 365/185.3, 185.22, 365/185.24, 185.14, 185.29

(56) References Cited

U.S. PATENT DOCUMENTS

| | | |
|---|---|---|
| 4,119,995 A | 10/1978 | Simko |
| 5,233,562 A | 8/1993 | Ong et al. |
| 5,237,535 A | 8/1993 | Mielke et al. |
| 5,487,033 A | 1/1996 | Keeney et al. |
| 5,490,109 A | 2/1996 | Salmon |
| 5,619,454 A * | 4/1997 | Lee et al. ............... 365/185.09 |
| 5,822,252 A * | 10/1998 | Lee et al. ............... 365/185.23 |

* cited by examiner

Primary Examiner—A. Zarabian
(74) Attorney, Agent, or Firm—Blakely, Sokoloff, Taylor & Zafman LLP

(57) ABSTRACT

A technique of performing post erase repair on a flash memory by identifying a leaky column after the flash memory is erased. The leaky column is repaired first by programming memory cells of the column to increase the threshold voltage Vt of the memory cells to remove the leaky column condition prior to performing post erase repair on the memory cells. Then, each memory cell is verified and repaired to ensure that each memory cell has a Vt above an acceptable post erase repair value. By performing the column leakage repair first, over erased leakage from deselected cells are not present to give false indications when each cell is verified for the post erase repair Vt.

16 Claims, 6 Drawing Sheets

POST ERASE REPAIR TO ENHANCE PERFORMANCE IN A FLASH MEMORY

BACKGROUND OF THE INVENTION

1. Field of the Invention

The present invention relates to the field of memories and more particularly to a technique of performing post erase repair on flash memory.

2. Description of the Related Art

One type of non-volatile electrically erasable and electrically programmable read only semiconductor memory is commonly referred to as a flash memory. Once programmed, the flash memory retains the program data until the memory is erased. In a typical flash memory erase routine, a block of memory is erased instead of individual cells. A variety of flash memory devices are known in the art, but generally, a flash cell is comprised of a metal-oxide-semiconductor (MOS) transistor which includes an isolated or floating gate that is programmed, typically by electron injection from the channel.

In one typical configuration, a flash cell is programmed by applying a high voltage (such as 12 volts) on the control gate, 0 volts on the source and an intermediate voltage such as 6 volts on the drain. A channel-hot-electron injection causes the isolated or floating gate to be negatively charged. The charged floating gate causes the threshold voltage (Vt) of the device to increase. Thus, a programmed cell requires a higher threshold voltage to turn the transistor on as compared to an erased cell. In a read operation, generally, the source is grounded and a read voltage, such as 5 volts, is applied to the control gate and the output is determined at the drain. The amount of the read current at the drain determines if the device is programmed or not programmed.

In order to erase the programmed cell, the drain is made to float while a voltage is impressed across the source and the control gate, such as 12 volts on the source with a grounded control gate or 5 volts on the source with a negative voltage (such as –8 V) on the control gate. When the cell is being erased, charges are removed from the floating gate to the source terminal so that the threshold voltage of the device is reduced. Accordingly, the erase threshold voltage, Vte, is less than the program threshold voltage Vtp. Therefore, a programmed cell has a charged floating gate which requires a much higher threshold voltage to turn on the cell, while an erased cell has charges removed from the floating gate so that a lower threshold voltage will turn on the cell.

As noted above, flash memories are generally erased in chunks of memory cells commonly referred to as arrays or blocks. Thus, a block erase of a memory device results in all of the memory cells of that block undergoing an erase procedure. It is appreciated that multiple blocks generally reside within a flash memory device.

One common problem with the block erase is that some of the memory cells may be over erased. An over erased condition occurs when the threshold voltage of the device is near or below zero volts so that the cell will leak current (have a leakage current in the drain) when the cell is erased. Accordingly, after a block erase it is possible and typically probable that one or more cells will erase into this over erased condition. In order to repair the over erased cells, a typically known practice is to soft program the cells in a sequence so that the threshold voltage of the over erased cells are increased to an acceptable level where the leakage is minimized or removed.

A well known prior art practice utilizes a routine to soft program all of the cells on a given bit line so that the threshold voltage level of the cells are increased. In this technique, an erase verification test is performed on each bit line and when a current exceeds a preselected reference value the bit line is noted to have one or more cells in the over erased condition. In this instance, the cells on the bit line are programmed through a sequence of steps in which the programming voltage is increased at predefined steps, until all of the cells of the bit line pass the current test or until the maximum repair programming voltage is reached at which point failure of the erasing program is noted.

One problem with this technique resides in the manner the verification of each cell is performed after a block erase procedure. Each cell on the bit line is verified to determine if it is properly erased. When a particular cell is selected, its bit line is checked to ensure that the cell is not in the over erased condition. Generally, it is preferable to program the cells such that each cell is at a minimum desired threshold voltage for proper operation of the cell. A problem with this technique is the difficulty in determining if the verified cell is operating below the desired threshold voltage or if one of the other deselected cells on the same bit line has excessive leakage current due to an over erased condition (such as having a negative threshold voltage) if the bit line indicates excessive current.

Therefore, monitoring the bit line to perform the over erase repair of memory cells utilizing this known technique requires a considerable number of looping through the array in order to blindly program each of the cells on the bit line until the current is below the accepted limit. When numerous cells are on a given column (such as in excess of 500 cells), significant programming time is required to sequence through the repair algorithm to repair cells on a given bit line.

What is needed is an improved technique to enhance the repair and verification of erased memory cells.

DETAILED DESCRIPTION OF THE INVENTION

Figure 1:
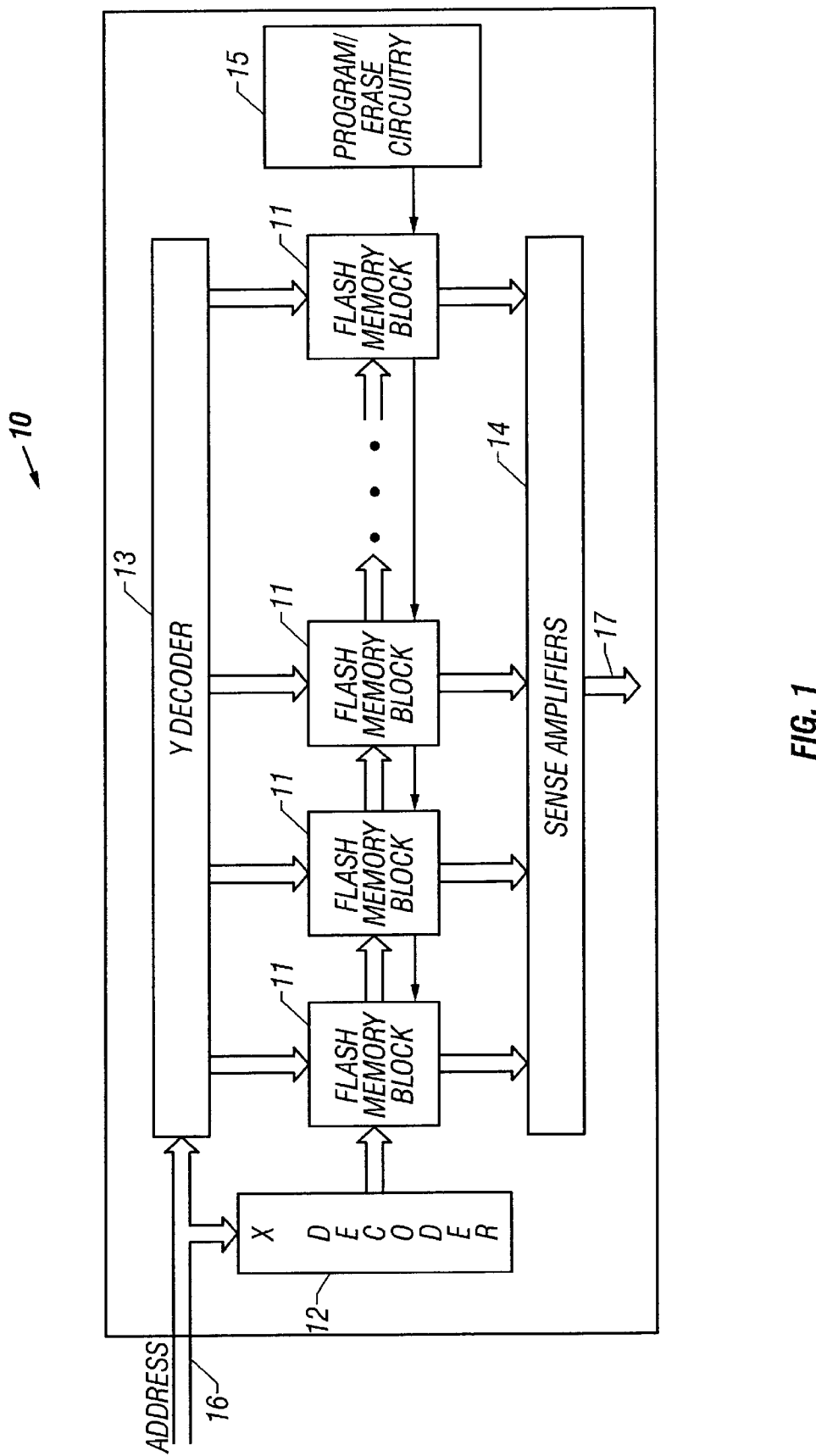
FIG. 1 is a block schematic diagram of a flash memory device utilizing the post erase repair technique of the present invention.

Referring to FIG. 1, a flash memory device 10 implementing a technique of the present invention is shown. The flash memory device 10 is comprised of a number of flash memory blocks 11, one or more x (row) address decoder 12, one or more y (column) address decoder 13 and a plurality of sense amplifiers 14 to sense the output of the memory blocks 11. A circuitry 15 is also included in order to program and erase the memory cells of each of the memory blocks 11. It is appreciated that other components are present within a typical flash device; however, only the circuitry pertaining to the operation of the invention is included in FIG. 1.

Memory cells of a flash memory are typically configured into one or more memory arrays in which cells of the array are accessed by x and y address components. Generally, the row address is decoded by the x decoder, such as x decoder 12, and the column address is decoded by a column decoder, such as y decoder 13. Accordingly, as shown in FIG. 1, the x decoder 12 decodes the row address component for accessing the memory blocks 11 while the y decoder 13 decodes the y address component for accessing the column of the array for each of the memory blocks 11. As shown in FIG. 1, the address component for accessing a particular memory cell or cells is shown as ADDRESS on bus 16.

When in the read mode, the sense amplifiers 14 sense the state of the memory cells and provide corresponding outputs on bus 17. In the particular arrangement shown in FIG. 1, each of the flash memory blocks 11 are configured as erase blocks for performing a flash block erase. That is, each block 11 of FIG. 1 corresponds to a block of memory cells which are block erased when a flash erase routine is performed. The actual number of memory cells in each block 11 can vary significantly and in one embodiment each block 11 is comprised of approximately 0.5 million memory cells. Again, how these memory cells are arranged is a design choice but generally the cells are arranged in an array configuration.

The program/erase circuitry 15 is coupled to the flash memory blocks 11 in order to perform the block erase and the subsequent post erase repair and verification procedure to ensure that the memory cells have a minimum threshold voltage for subsequent proper operation of the memory cells. The arrangement of the various memory cells are better exemplified in detail in FIG. 2.

Figure 2:
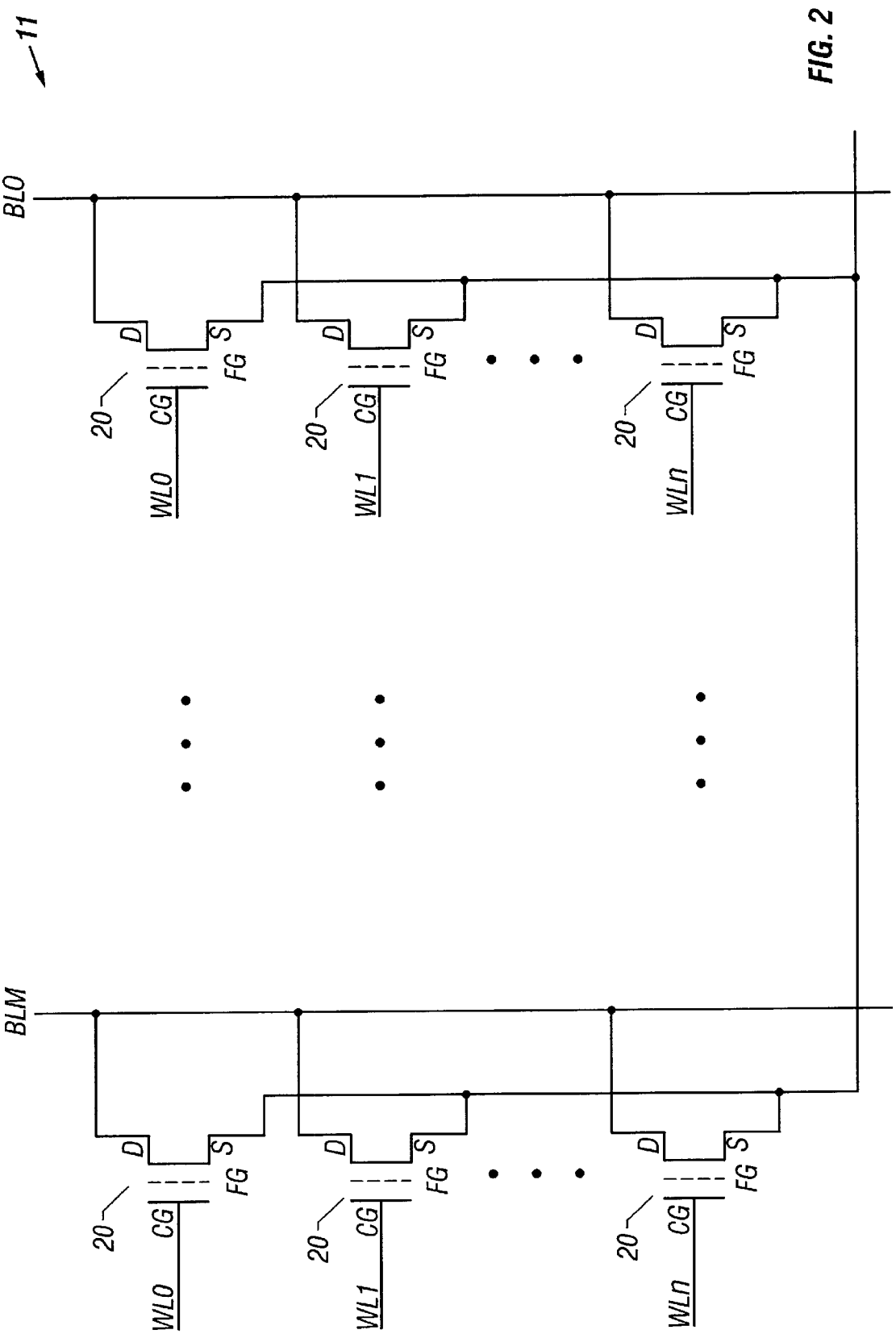
FIG. 2 is a schematic diagram illustrating a portion of one of the flash memory blocks shown in FIG. 1 in which a number of flash memory cells are shown.

Also referring to FIG. 2, an example array configuration for memory cells in an erase block are shown. It is appreciated that only a few transistors of the array are shown in FIG. 2. The shown portion of block 11 is comprised of a plurality of flash memory cells 20, in which each cell is comprised of a control gate (CG), a floating gate (FG), a drain (D) and source (S). It is to be noted that each transistor 20 shown is an n-type device, such that the drain of the transistor is coupled to a bit line while the control gate is coupled to a corresponding word line. It is appreciated that the circuitry could be implemented using p-type devices as well.

In an array format, the transistors which form a row have their control gates coupled together to the corresponding word line, shown as WL0-WLn in FIG. 2. Equivalently, the transistors of a column have their drains coupled together to the corresponding bit line BL0–BLm. (With p-type MOS devices, the source/drain configuration would be reversed.) When the transistors 20 form the transistors of a flash erase block 11, the transistors are erased in a block operation in which charges are removed from the isolated or floating gate FG so that the threshold voltage Vt is lowered to the erased threshold voltage Vte.

In one embodiment, this is achieved by providing a voltage difference between the source terminal and the control gate terminal while the drain is made to float. For example, for the circuit shown, the control gate can be grounded while a positive 12 volts is applied to the source or alternatively, the control gate can be at a negative voltage, such as −8 volts, while the source is at a lower positive voltage, such as plus 5 volts. In another erase mode referred to as channel erase, a positive voltage is placed on the body of the device and a negative voltage is placed on the gate. It is to be noted that other configurations and voltages can be readily used. Also, more recent flash devices will typically use lower voltages.

The block erase operation performed by circuitry 15 of FIG. 1 ensures that each of the cells 20 is erased to have a Vte which is appreciably lower than a programmed threshold voltage Vtp. The programmed state is generally achieved by placing a higher potential on the control gate than the source while a voltage is also placed on the drain. In one embodiment to program a cell, 0 volts is placed on the source, 12 volts on the control gate and 6 volts on the drain terminal. Again, the actual voltages utilized for erasing and programming will depend on the particular flash device and is not critical to the understanding of the present invention.

Once the flash cells 20 are erased in a block erase operation, it is possible that one or more cells may be placed into an over erased condition. An over erased condition is when the threshold voltage of the memory cell is below an accepted value, and the over erased condition may include a situation in which the threshold voltage is negative. When a cell 20 is significantly over erased (especially in the instance where the threshold voltage is negative), the cell will conduct even if its wordline is not selected to activate (read) the memory cell. As noted in the background section above, some form of repair procedure is utilized to ensure that each of the cells 20 will have a minimum acceptable threshold voltage value for proper operation of the flash cell.

Figure 3:
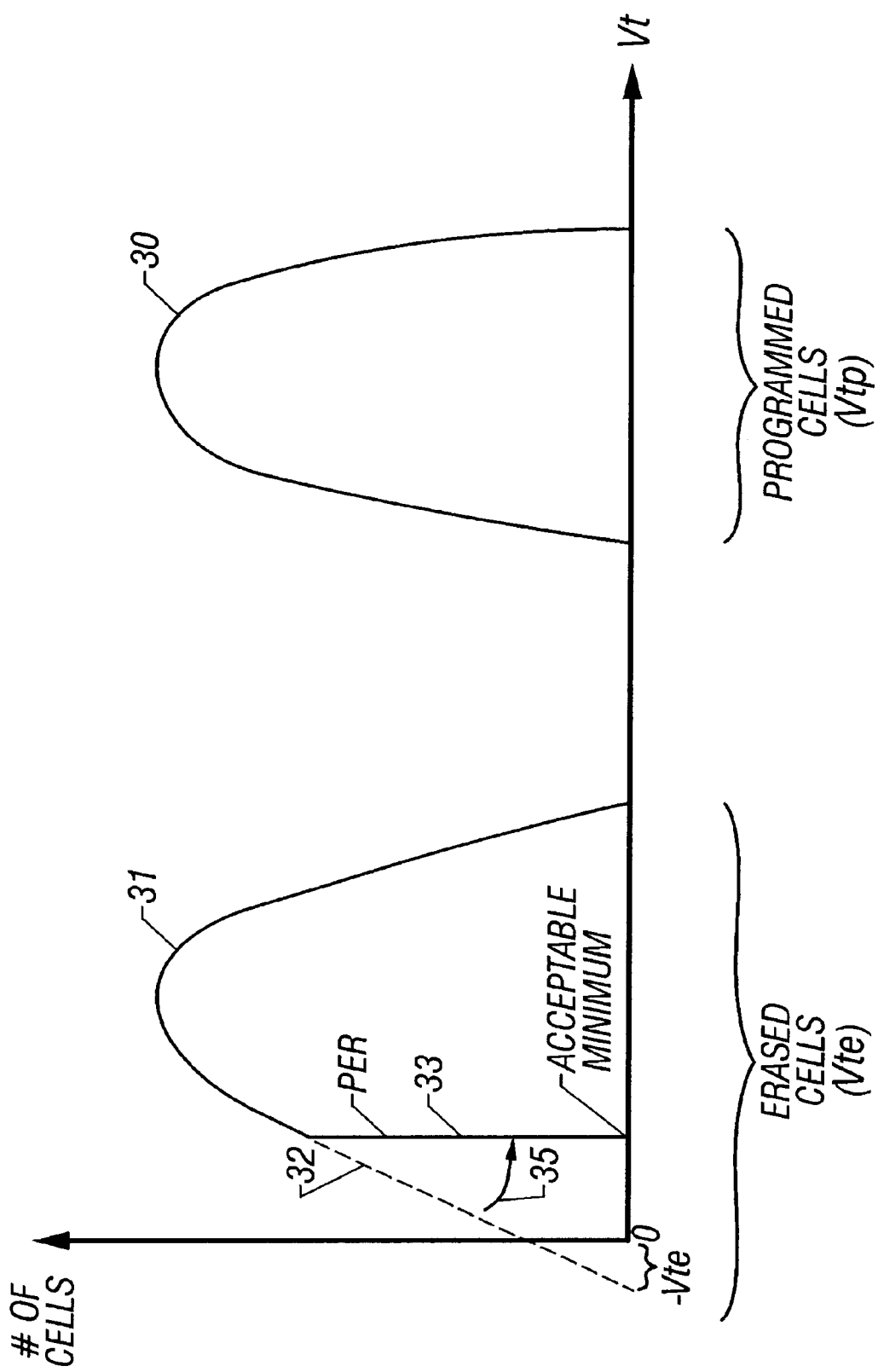
FIG. 3 is a graphical representation showing the distribution of flash cells versus threshold programming voltage and threshold erasing voltage.

FIG. 3 exemplifies a graph in which cell distribution is graphed versus the threshold voltage Vt. In FIG. 3, the cell distribution curve 30 illustrates the spread of the threshold voltage of the cells when the cells are programmed. That is, when the cells are programmed the distribution curve 30 exemplifies the number of cells which will program to a particular threshold programming voltage Vtp. Similarly, curve 31 exemplifies the number of cells which will erase to a particular threshold erasing voltage Vte when an erase routine is performed. As noted by curve 31, some of the cells are over erased below an accepted lower threshold erasing voltage and in some cases the cells are over erased significantly and have a threshold voltage of −Vte. The portion of the curve 31 falling below the minimum acceptable Vte is shown by dotted line 32. The portion of the dotted line extending into the negative region to the left of the origin signifies a −Vte condition. The −Vte portion of the graph will typically cause the cell to conduct even when the cell is deselected and generate a leakage current on the corresponding bit line.

During a post erase repair procedure, it is generally desirable to repair the over erased cells so that the cells will have a minimum acceptable Vte, which is noted as a post erase repair (PER) value or level 33 on curve 31. The PER value ensures that the erased cells will only conduct when the cells are selected by a gate voltage which causes the threshold voltage to be greater than the PER value. The present invention performs an over erase repair to raise the threshold voltage level of over erased cells so that their threshold voltages are raised to at least the PER value, which minimum threshold value is shown by line 33 in FIG. 3. Essentially, the cells in the over erased portion shown by the dotted line 32 have their threshold voltages increased to a value (level) which is at least the PER value or level 33. This is generally achieved by programming the over erased cells.

As noted in the background section above, a typical prior art verification program will commence the repair routine by reading an output on a bit line when one of the selected cells on the bit line is selected, while the remaining cells are deselected. If excessive current is noted on the corresponding bit line, then the column is blind pulsed to program each of the cells coupled to the bit line, then the next cell is tested. If an over current condition is noted on the corresponding bit line on a subsequent verification test, then the cells are again programmed, but at a higher gate bias voltage. This procedure is repeated in which the programming gate bias voltage is incremented pursuant to the program routine. It is hoped that at some point the over erased cells are repaired to an acceptable Vte so that the current drain on the bit line is below a reference value. The repair and verify process should ensure that below a set Vte, none of the cells are conducting.

A problem of the prior art technique is that during the verification process, it is difficult to determine if the particular selected cell is operating at a lower Vte than the PER value or if one or more of the other cells (deselected cells) of the column are over erased, if the leakage current is higher than the acceptable reference. The prior art technique described above fails to differentiate if the excessive current is due to the failure of the particular cell being verified or if the excessive current is due to one or more of the deselected cells is in a leakage condition.

The present invention implements a post erase repair routine in which the over erased leakage is repaired prior to verifying the Vte of each of the memory cells. A particular embodiment of the present invention is shown as post erase repair or PER routine 40 in FIGS. 4A–B. The PER routine 40 exemplified in FIGS. 4A–B has two distinct sequences to repair the over erased cells. A first portion of the routine 40 is exemplified in FIG. 4A, in which leakage cells (typically those cells having a negative Vte) are repaired so that the threshold voltage of those leakage cells are raised to a point at least above 0 Vte. Then, in the second sequence of the routine 40, which is shown in FIG. 4B, each of the cells are then verified to ensure that the threshold voltage value is above the acceptable minimum Vte value, noted as the PER value. The PER value in one embodiment is shown by line 33 in FIG. 3. Ultimately when the two repair procedures are performed, all of the erased cells will have their threshold voltage level at or above the PER value.

Figure 4A:
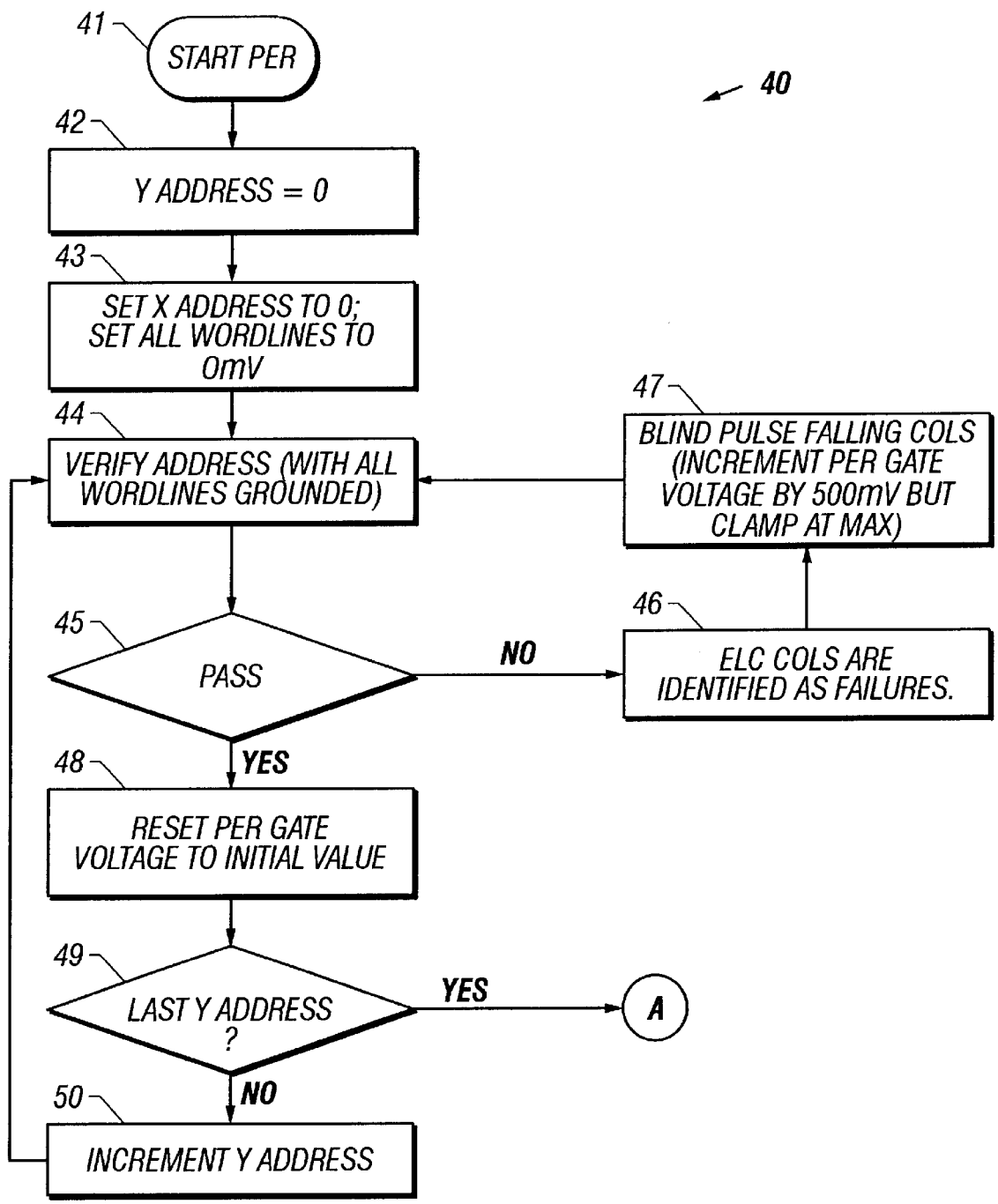
FIGS. 4A and 4B show a flow chart to perform post erase repair of flash cells in which an ELC column repair is performed first followed by a PER repair.
Figure 4B:
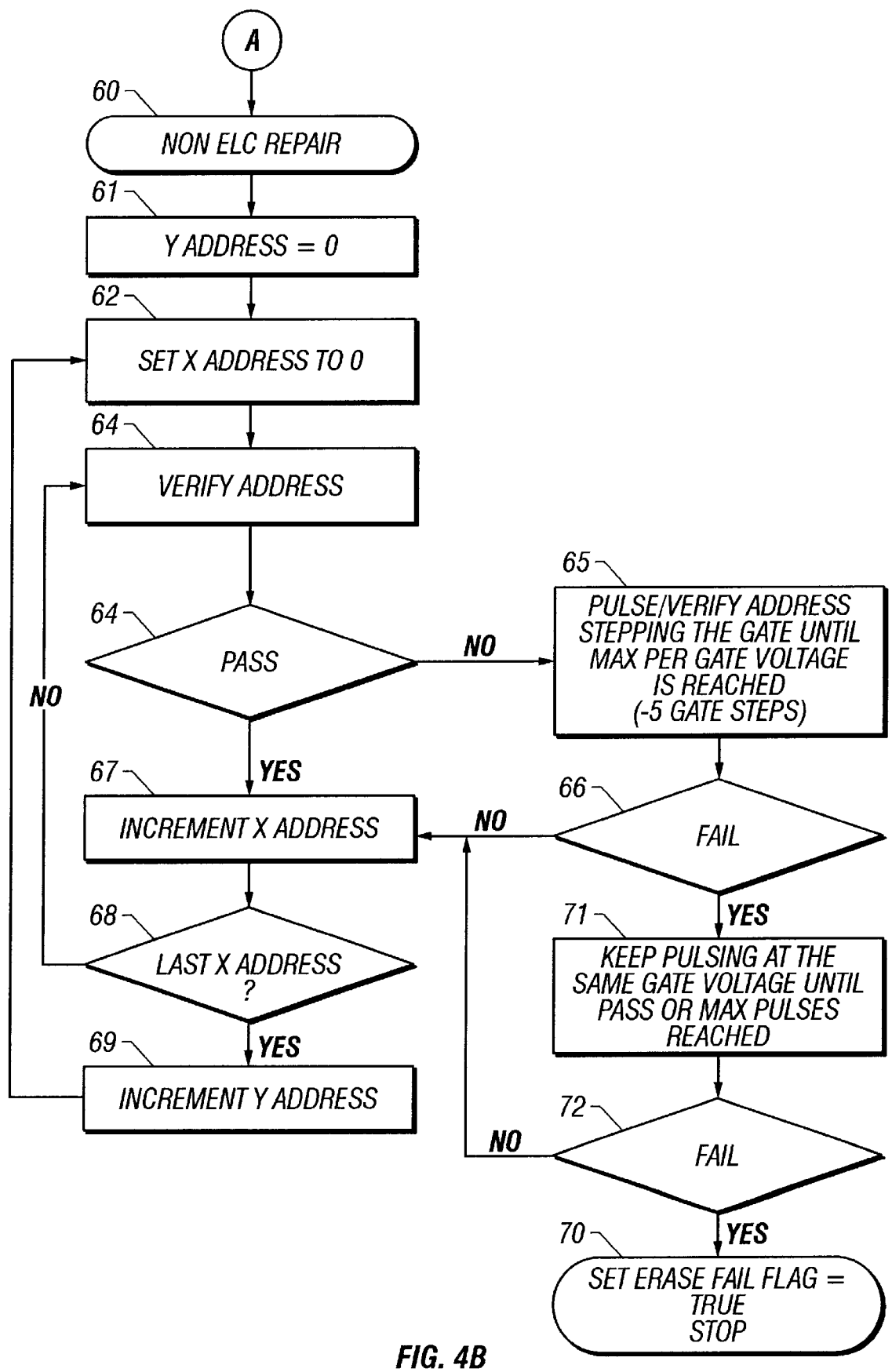

Referring to FIG. 4A, the commencement of the routine 40 is shown starting in block 41. Assuming that the particular flash memory device is configured into an x-y array, the y address is initialized to its starting address. In the example shown, the y address is set to 0 as shown in block 42. Next the x address is set to its starting address (shown in block 43), which in the example is shown as 0. Also as noted in block 43, all of the word lines of the array are deselected. A deselected condition is shown as 0 volts in block 43. That is, the word lines are deselected by having them grounded (0 V).

The grounding of the word lines places a ground potential on the control gate of the memory cells of the array (see FIG. 2) so that cells with a positive Vte should not be conducting. Accordingly, the address is verified (read and compared) to determine if there is excessive current on the corresponding bit line. The verification test attempts to determine if there is current flow above a specified reference on the corresponding bit line BLx. Since all of the cells on a particular column are grounded, any excessive current on the bit line can be attributed strictly to leakage current and not to a selected cell in a low Vte condition. That is, since none of the cells have been selected, any excessive current noted on the bit line can be attributed to those cells which over erased into a negative Vte region (see FIG. 3 for graphical representation of the –Vte region for erased cells).

If a leaky column is detected (block 45) then the column is identified as an erase leaky column ELC and fails the leakage test (block 46). When an ELC failure occurs, the cells of the leaky column are pulsed commencing at a base or initialization programming voltage to program the cells of the leaky column (block 47). Once all of the cells of the leaky column have been programmed, then the column is again tested with the word lines grounded to determine if the leaky condition remains. This is done by the repeating of the processes identified in reference to blocks 44 and 45.

If the ELC is again identified as failing the leakage test (block 46) then the PER gate voltage to program the cells of the column are incremented to the next step value (shown in block 47) at which time the memory cells of the column are again programmed but this time at a higher incremented voltage. This higher voltage insures that the cells are programmed to a higher Vte. After the pulsing of the cells shown in block 47, the column is again tested to determine if the leakage condition remains (blocks 44 and 45). This cycle of testing for a leaky column and programming the cells in which the gate bias voltage is incremented at each sequential cycle is repeated until either the column passes the leakage test (at block 45) or until a maximum allowable bias voltage is reached.

In the example shown in FIG. 4A, the PER gate voltage commences at approximately 3 volts and is incremented by 500 millivolts at each cycle of the loop until a maximum allowable PER gate voltage is reached. The actual PER commencing voltage, as well as the incremental step voltage, can vary depending on the particular flash device. It is to be noted that setting of a maximum clamping voltage for the PER gate bias is a design choice but should not be so high as to program cells above the maximum designated Vte. Since over erased cells having –Vte program quickly to raise the Vte value, typically a few programming cycles is sufficient to raise the threshold voltage out of the negative region.

If a particular column passes the leakage test (block 45), whether at the initial test or during one of the passes after the pulsing of the column, the column has been identified to not have a leaky condition. In this event, the column current is now below the acceptance level. Then, the PER gate voltage is reset to the initial value (block 48). If this is the last y address, then the routine transitions to the non ELC repair which commences on FIG. 4B. If this is not the last y address, then the y address is incremented (block 50) and the routine returns to block 44 to perform the leakage test as described above in reference to blocks 44–47.

It is to be appreciated that the portion of the routine 40 shown in FIG. 4A reads and tests the cells and identifies leaky columns that may cause a verify to give a false reading. Those leaky columns are identified as failures and then subsequently pulsed to raise the Vte of the cells of the leaky column. The entire leaky column is programmed commencing at a low gate bias voltage and the voltage incremented during each loop until either the column stops leaking or until the maximum clamping voltage is reached. Once the column passes the leakage test, a post erase verify operation can now be used reliably to find those cells having a low threshold Vte.

This portion of the non-ELC repair is shown in FIG. 4B commencing at block 60. The x and y addresses are set to their initialization values, shown as 0 in this example at blocks 61 and 62, so that a verification of the array can be performed at block 63. The verification process selects the word line(s) of that address so that a gate bias voltage corresponding to the PER value 33 (of FIG. 3) is placed on the word line of the selected cell. In the verification process (block 63), the column current is again checked to determine if it is above an acceptable reference current (block 64). If a high current condition is noted, then the cell fails the verification test and undergoes a pulse erase repair process shown in block 65.

In block 65, the gate bias voltage is incremented at preselected steps from an initialization value to programmed the selected cell to increase its Vte. After each programming sequence, the cell is again verified to determine if it has a Vte above the PER value. The procedure is repeated at incremental programming voltages, until the cell is verified to have a Vte of at least the PER value or in this example, until a maximum number of gate steps have been reached. Thus, the PER value repair is performed by incrementally programming the cell until an acceptable Vte is reached.

Then the x address is incremented (block 67) and if this is not the last x address (block 68), then the verification process commencing at block 63 is repeated with the new x address. If the x address is the last address in block 68, then the y address is incremented (block 69) and the routine is returned to block 62 where the x address is again set to the initialization address or 0 in this example. The process is repeated until all x and y addresses have been completed.

As noted in block 66, if a selected cell cannot be programmed to increase its Vte to at least the PER value, then a failure is noted (block 70). However, in this particular example, an additional pulsing is initiated for a specified repetition (block 71) in order to program the particular cell, at which point if the cell cannot be programmed to pass the verification test (block 72), then the fail condition is noted (block 70).

It is appreciated that the routine 40 described in the flow chart of FIGS. 4A–4B is but one embodiment for practicing the invention. The invention identifies a leaky column that may cause the verify to give a false reading prior to performing the PER verification sequence. In determining a leaky column, ELC, the word lines of a cell are deselected so that only those ELC columns are subjected to an ELC repair. Once a column has been determined not to have leaky cells present on that column, the cells can then be verified to insure that each of the cells will have a Vte above the acceptable PER value. The verification process strictly involves PER to raise the Vte of the cells to at least the minimum acceptable PER value. In one embodiment, the PER value is established so that all cells below a Vt of approximately 1.5 volts are repaired.

An advantage of the present invention is that the post erase repair process is separated into two distinct sequences in which the first portion allows for ELC repair. Once a leaky column condition is repaired then the verification operation can be used reliably to find any other cells that have low threshold voltage and these cells can be programmed above the PER value using a stepped gate programming operation. Once a cell has been verified, then that verification is know to be true since an ELC condition had been earlier removed. Thus, when a cell has been verified, then it is known that the verification is true. The verification process can now step through each of the cells and the programming of the cells by stepping the gate voltage. if necessary.

By ensuring that the verification procedure is not corrupted by a leaky column, the PER performance is improved over the prior art technique of attempting to verify the cells of a column but in which the verification process could not determine if the leakage was due to the selected cell having a low Vte or another deselected cell on the column being leaky. Since programming a cell needs a higher voltage to charge nodes while a verify (read) operation typically requires a lower voltage operation on a discharge node, significant time is may be incurred in charging and discharging the various nodes associated with a memory cell. By utilizing the technique of the present invention, such as the example routine 40 shown in FIG. 4A–B, post erase repair performance can be enhanced significantly over the prior art. In some instances, the post erase repair performance can be improved by a factor of up to 30 percent.

Figure 5:
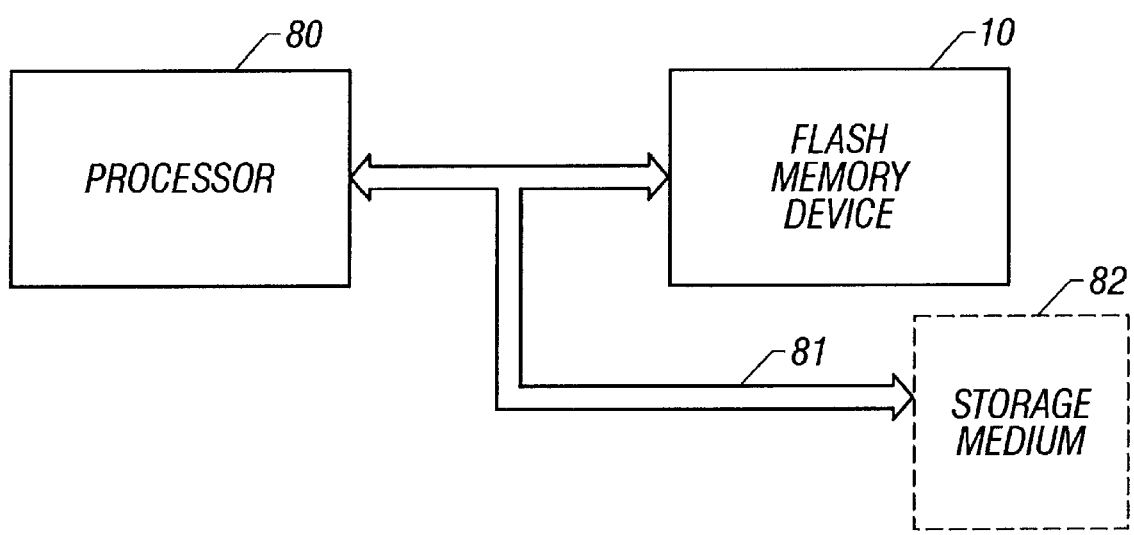
FIG. 5 is a block diagram showing one system configuration for utilizing the post erase repair on a flash memory.

Referring to FIG. 5, it is appreciated that the flash memory device 10 can be operated together with a processor to practice the present invention. One system configuration is shown in FIG. 5 in which the flash memory device 10 is coupled to a processor 80. The processor controls the operation of the flash memory 10 as well as performing the PER routine on the flash memory 10. The routine 40 can be resident on the flash memory 10, in the processor 80 or on some other machine readable storage medium 82 coupled to the processor 80 on bus 81. A variety of other configurations and systems can be devised in order to utilize the flash memory device incorporating the present invention. Thus, post erase repair to enhance performance in a flash memory is described.

I claim:

1. A method comprising:
   identifying a leaky current condition on an output line of a memory after the memory is erased, wherein the memory includes a plurality of memory cells;
   increasing a threshold voltage Vt of all memory cells coupled to the output line to remove the leaky current condition on the output line; and
   verifying each memory cell coupled to the output line to ensure that each memory cell has a Vt above an acceptable post erase repair value, after the leaky current condition on the output line has been removed.

2. The method of claim 1 in which the verifying includes programming a particular memory cell to increase its Vt, if the particular cell has a Vt below the acceptable post erase repair value.

3. The method of claim 1 in which the verifying includes programming a particular memory cell, if the particular memory cell has a Vt below the acceptable post erase repair value, and wherein the programming is performed until the particular memory cell has its Vt raised above the acceptable post erase repair value.

4. The method of claim 1 in which the memory is a flash memory wherein the memory cells are deselected when identifying the leaky current condition, but are selected for verifying.

5. A method comprising:
   identifying a leaky column of memory cells of a flash memory after the flash memory is erased, in which the leaky column exhibits an over erased condition having excessive leakage current;
   increasing a threshold voltage Vt of all the memory cells of the leaky column to remove the excessive leakage current; and
   verifying each memory cell of the leaky column to ensure that each memory cell has a Vt above an acceptable post erase repair value, after the excessive leakage current on the output line has been removed.

6. The method of claim 5 in which the verifying includes repairing a particular memory cell to increase its Vt, if the particular cell has a Vt below the acceptable post erase repair value.

7. The method of claim 5 in which the verifying includes repairing a particular memory cell, if the particular memory cell has a Vt below the acceptable post erase repair value, and wherein the repairing is performed by programming the particular memory cell until the particular memory cell has its Vt raised above the acceptable post erase repair value.

8. The method of claim 7 in which the programming of the particular memory cell is achieved by incrementally driving a gate voltage of the particular memory cell.

9. A method comprising:
   determining if a particular column of memory cells of a flash memory has excessive leakage current on a bitline coupled to the column of memory cells, wherein each memory cell includes a wordline that is deselected;
   increasing a threshold voltage Vt of all the memory cells of the column to remove the excessive leakage current, if the column has excessive leakage current, prior to verifying that each memory cell of the column has a Vt above an acceptable post erase value; and
   verifying each memory cell of the column by selecting each memory cell individually to ensure that each selected memory cell has a Vt above an acceptable post erase repair value, and if not, repairing the selected memory cell not meeting the post erase repair value by programming the selected memory cell until the Vt is above the acceptable post erase repair value.

10. The method of claim 9 in which the programming to repair the selected memory cell is achieved by increasing its Vt above the acceptable post erase repair value, if the selected memory cell has a Vt below the acceptable post erase repair value.

11. The method of claim 10 in which the programming to repair the selected memory cell is achieved by driving a gate voltage of the selected memory cell.

12. The method of claim 10 in which the programming to repair the selected memory cell is achieved by incrementally driving a gate voltage of the selected memory cell.

13. A machine-readable medium that provides instructions, which when executed by a machine, causes the machine to perform operations comprising:
   determining if a particular column of memory cells of a flash memory has excessive leakage current on a bitline coupled to the column of memory cells, wherein each memory cell includes a wordline that is deselected;
   increasing a threshold voltage Vt of all the memory cells of the column to remove the excessive leakage current, if the column has excessive leakage current, prior to verifying that each memory cell of the column has a Vt above an acceptable post erase value; and
   verifying each memory cell of the column by selecting each memory cell individually to ensure that each selected memory cell has a Vt above an acceptable post erase repair value, and if not, repairing the selected memory cell not meeting the post erase repair value by programming the selected memory cell until the Vt is above the acceptable post erase repair value.

14. The machine-readable medium of claim 13 in which the programming to repair the selected memory cell is achieved by increasing its Vt above the acceptable post erase repair value, if the selected memory cell has a Vt below the acceptable post erase repair value.

15. The machine-readable medium of claim 14 in which the programming to repair the selected memory cell is achieved by driving a gate voltage of the selected memory cell.

16. The machine-readable medium of claim 14 in which the programming to repair the selected memory cell is achieved by incrementally driving a gate voltage of the selected memory cell.

* * * * *

UNITED STATES PATENT AND TRADEMARK OFFICE
CERTIFICATE OF CORRECTION

PATENT NO. : 6,462,990 B1
DATED : October 8, 2002
INVENTOR(S) : Keeney

It is certified that error appears in the above-identified patent and that said Letters Patent is hereby corrected as shown below:

Column 8,
Line 23, after "device" insert -- 10 --.

Signed and Sealed this

Fifteenth Day of July, 2003

JAMES E. ROGAN
*Director of the United States Patent and Trademark Office*